US010779435B2

(12) United States Patent
Shabbir et al.

(10) Patent No.: US 10,779,435 B2
(45) Date of Patent: Sep. 15, 2020

(54) SYSTEM AND METHOD FOR THERMAL CONTROL IN A MODULAR CHASSIS

(71) Applicant: Dell Products L.P., Hopkinton, MA (US)

(72) Inventors: Hasnain Shabbir, Round Rock, TX (US); William Kenneth Coxe, III, Round Rock, TX (US)

(73) Assignee: Dell Products L.P., Hopkinton, MA (US)

(*) Notice: Subject to any disclaimer, the term of this patent is extended or adjusted under 35 U.S.C. 154(b) by 0 days.

(21) Appl. No.: 16/243,442

(22) Filed: Jan. 9, 2019

(65) Prior Publication Data

US 2020/0221603 A1 Jul. 9, 2020

(51) Int. Cl.
*H05K 7/20* (2006.01)
*G06F 1/20* (2006.01)

(52) U.S. Cl.
CPC ......... *H05K 7/20209* (2013.01); *G06F 1/206* (2013.01); *H05K 7/20145* (2013.01)

(58) Field of Classification Search
CPC .................... B65D 19/42; B65D 19/44; B65D 2519/00024; B65D 2519/00059; B65D 2519/00094; B65D 2519/00273; B65D 2519/00293; B65D 2519/00323; B65D 2519/00333; B65D 2519/00373; B65D 2519/00562; B65D 2519/00572; B65D 2519/00741; B65D 2519/00781; B65D 2519/00796; B65D 2519/00805; B65D 2519/0081; B65D 2519/00815; B65D 85/48; B65G 1/02
See application file for complete search history.

(56) References Cited

U.S. PATENT DOCUMENTS

| | | | | |
|---|---|---|---|---|
| 7,316,606 B2 * | 1/2008 | Shipley | G06F 1/20 | 312/236 |
| 8,482,917 B2 * | 7/2013 | Rose | H05K 7/20727 | 361/679.48 |
| 2007/0002536 A1 * | 1/2007 | Hall | G06F 1/20 | 361/695 |
| 2013/0107454 A1 * | 5/2013 | Wilke | H05K 7/20727 | 361/694 |
| 2013/0258582 A1 * | 10/2013 | Shelnutt | G06F 1/206 | 361/679.48 |
| 2014/0073234 A1 * | 3/2014 | Elison | H05K 7/20727 | 454/184 |
| 2014/0268546 A1 * | 9/2014 | Mayhall | G06F 1/20 | 361/679.47 |
| 2016/0275993 A1 * | 9/2016 | Kwon | G06F 1/20 | |

* cited by examiner

*Primary Examiner* — Kidest Bahta
(74) *Attorney, Agent, or Firm* — Chamberlain, Hrdlicka, White, Williams & Aughtry

(57) ABSTRACT

An information handling system includes a rear node that includes an airflow control device a thermal manager. The thermal manager identifies a front node mating event between the rear node and a front node; in response to the front node mating event: obtains front node airflow characteristics for the front node; determines an airflow rate using, at least in part, the front node airflow characteristics; and sets an operating point of the airflow control device based on the airflow rate.

18 Claims, 15 Drawing Sheets

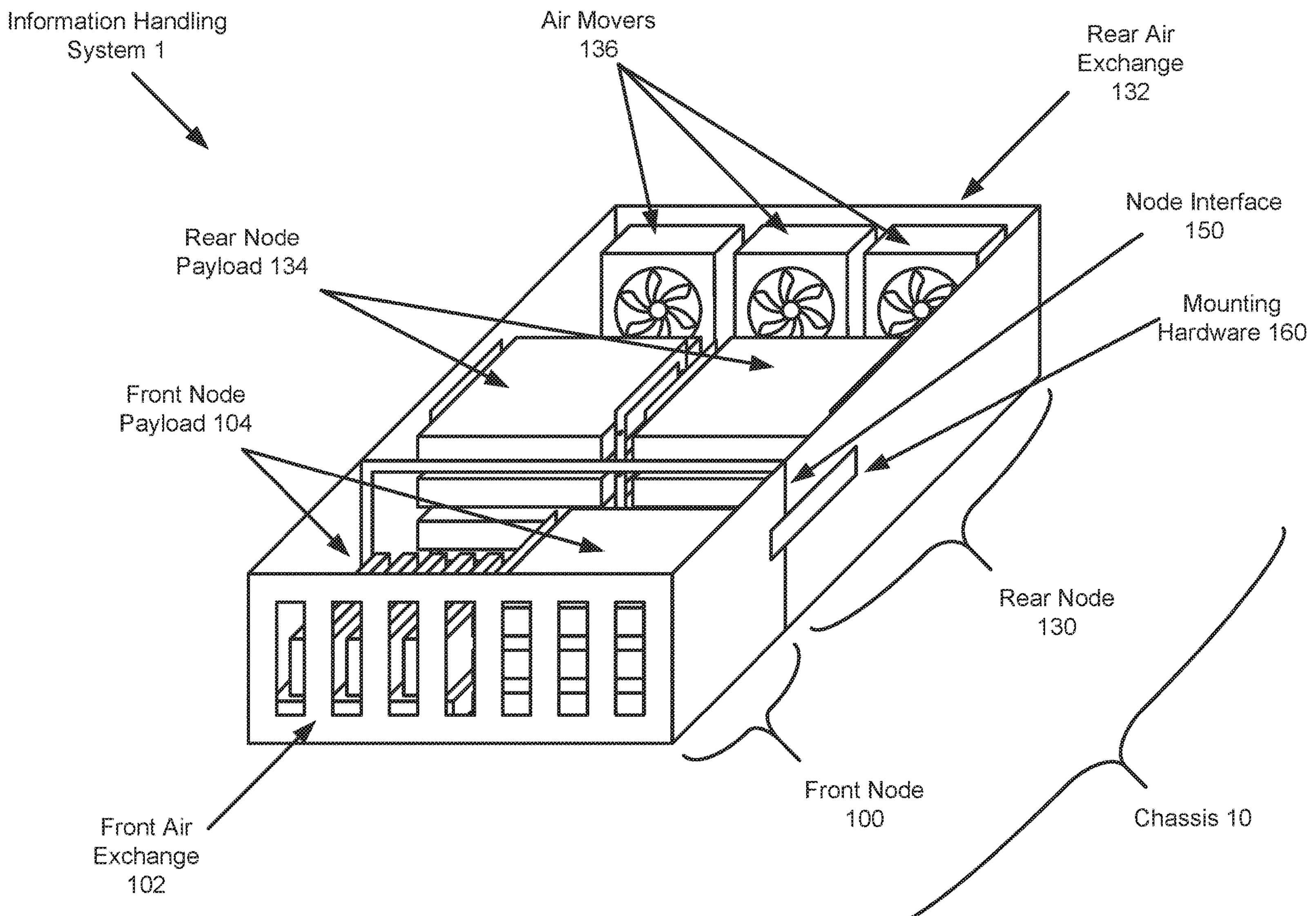
FIG. 1.1

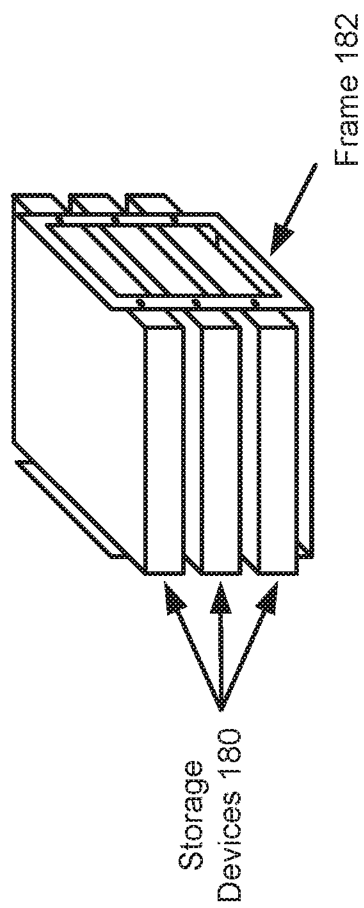
FIG. 1.3
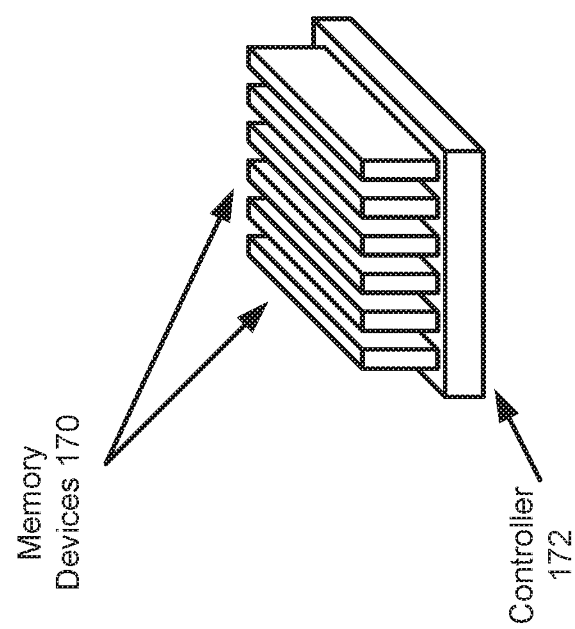
FIG. 1.2

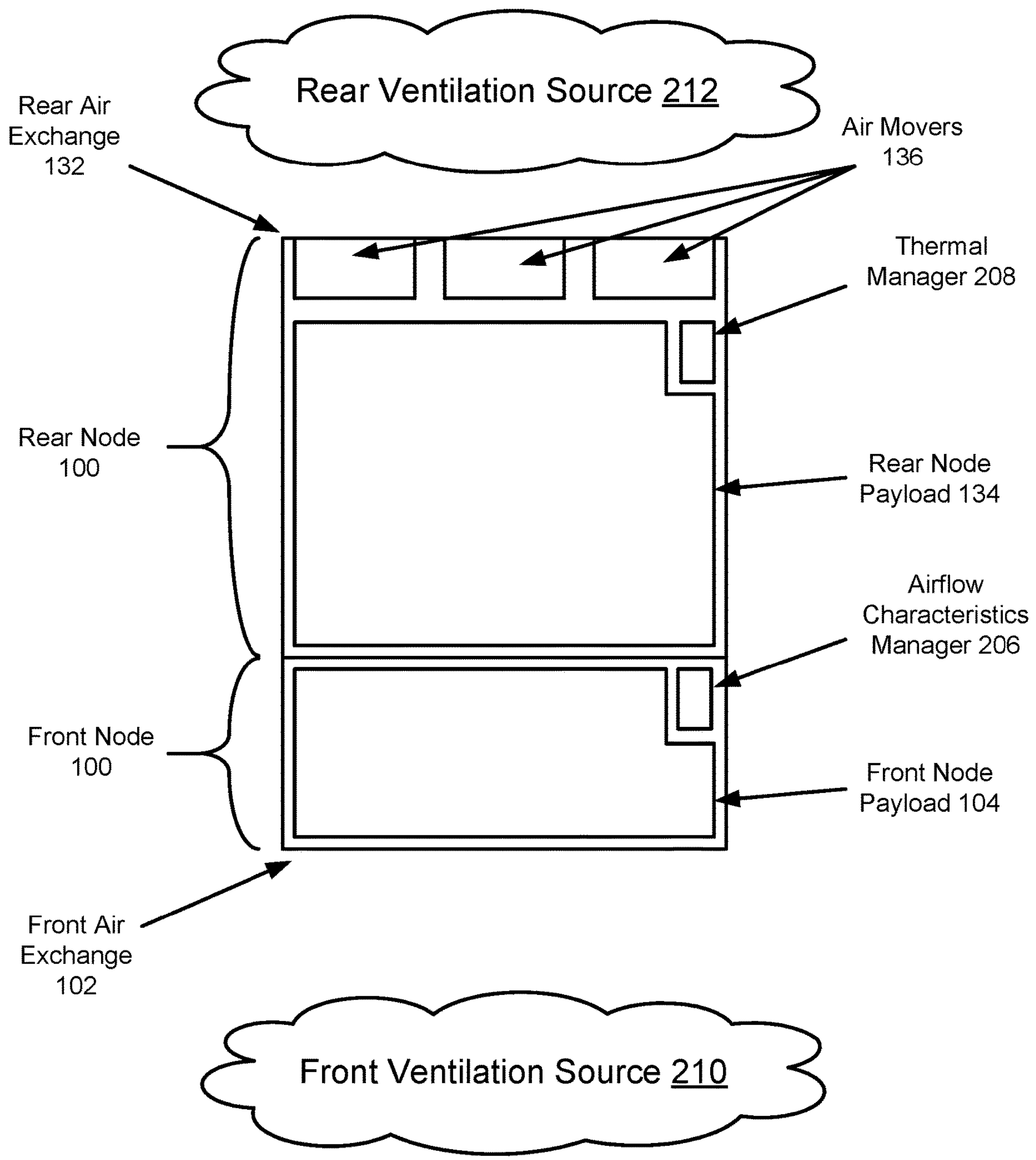
FIG. 2.1

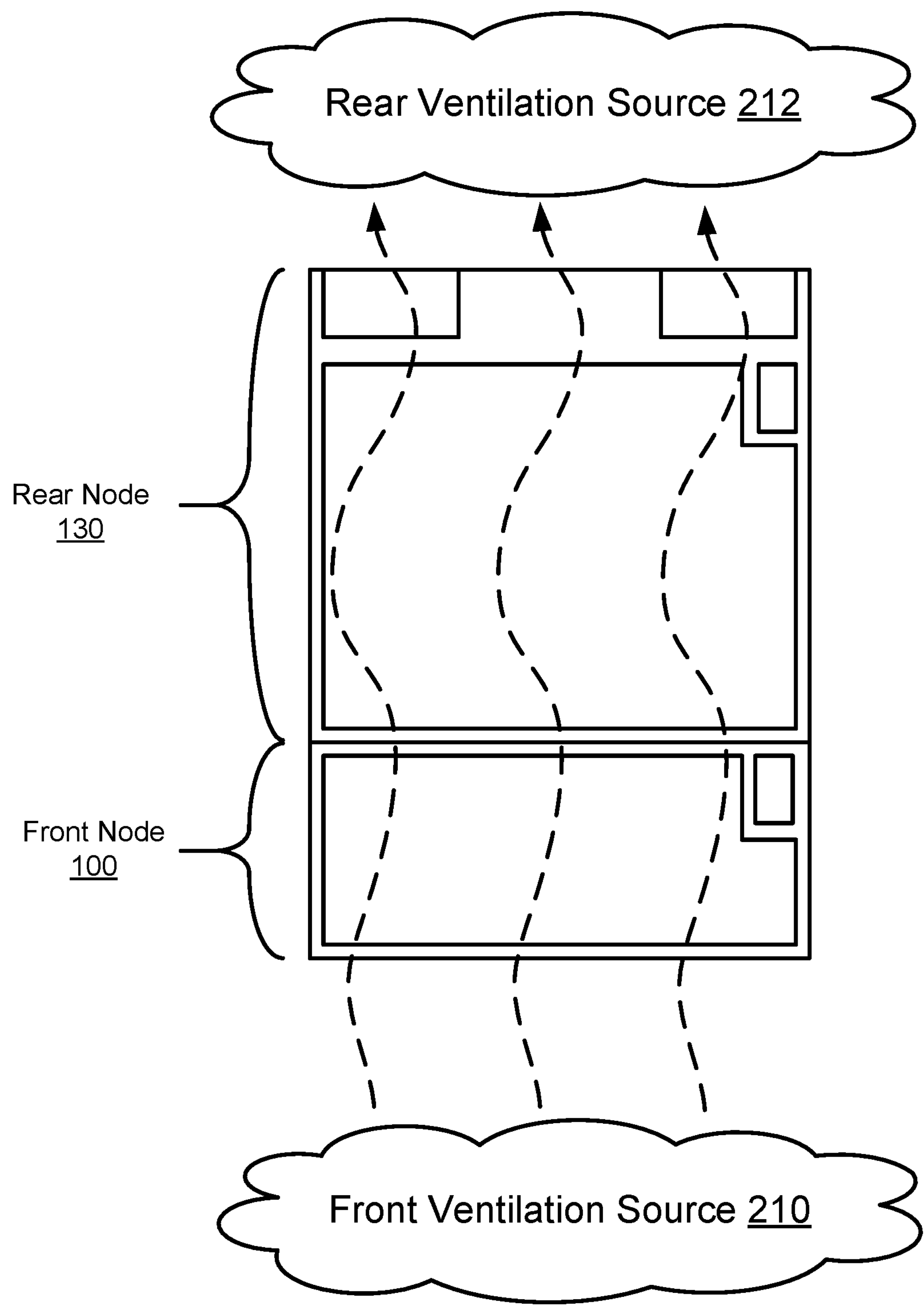
FIG. 2.2

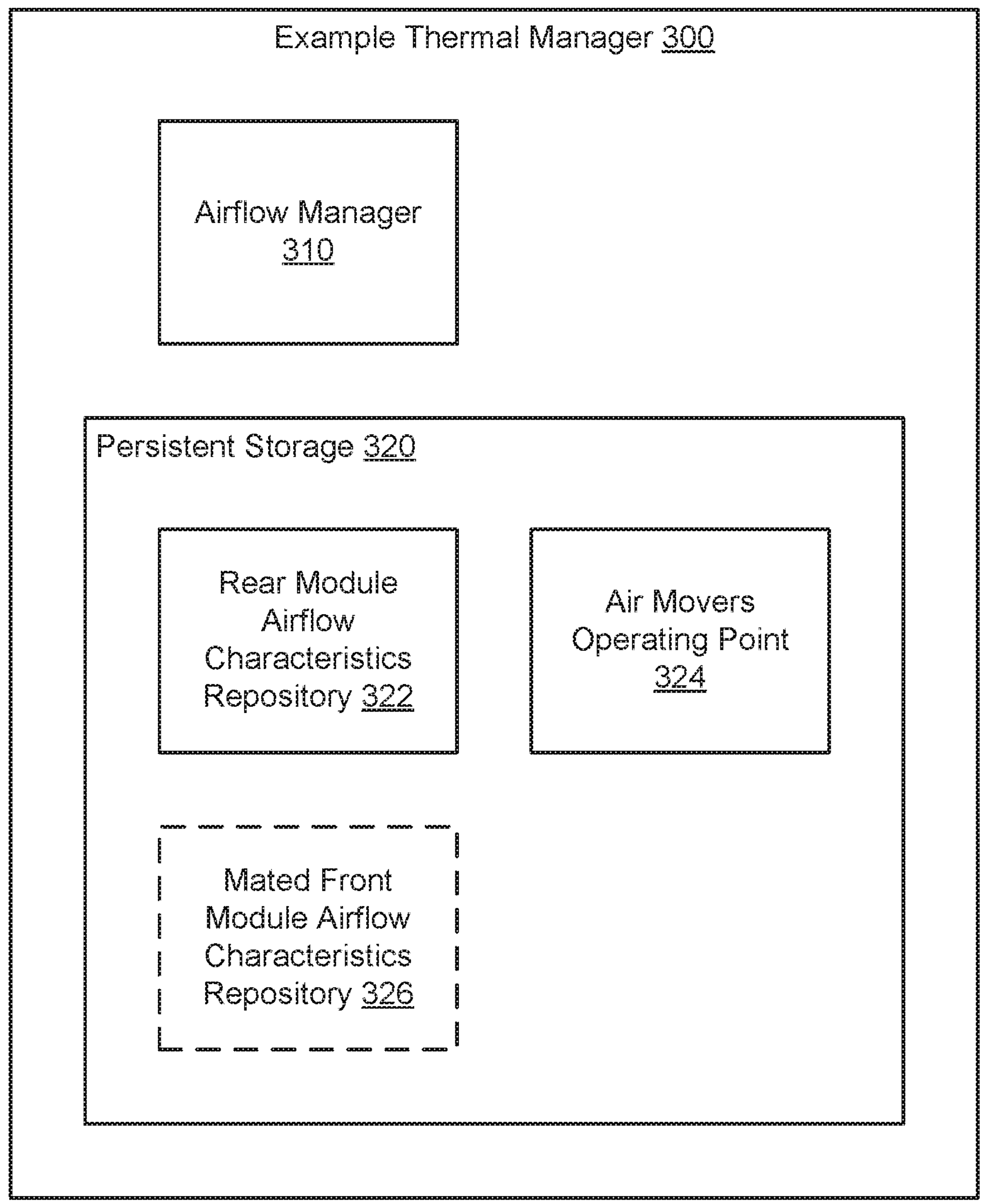
FIG. 3.1

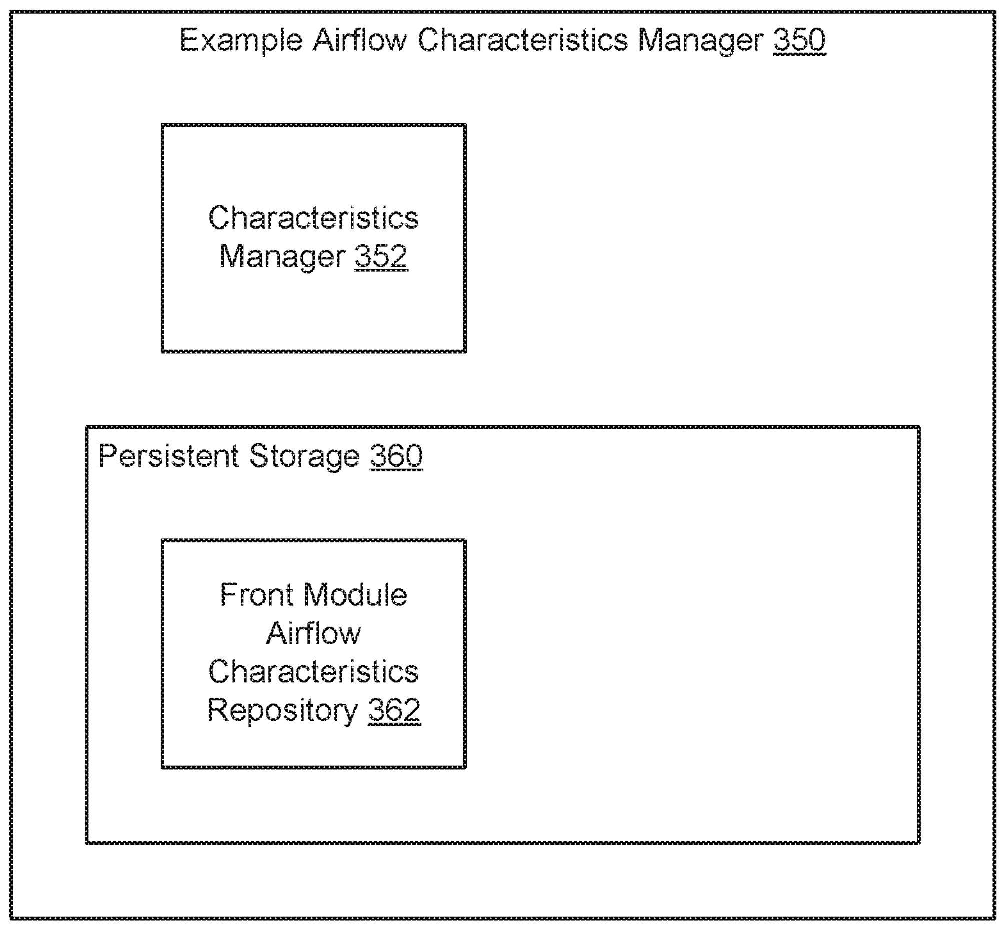
FIG. 3.2

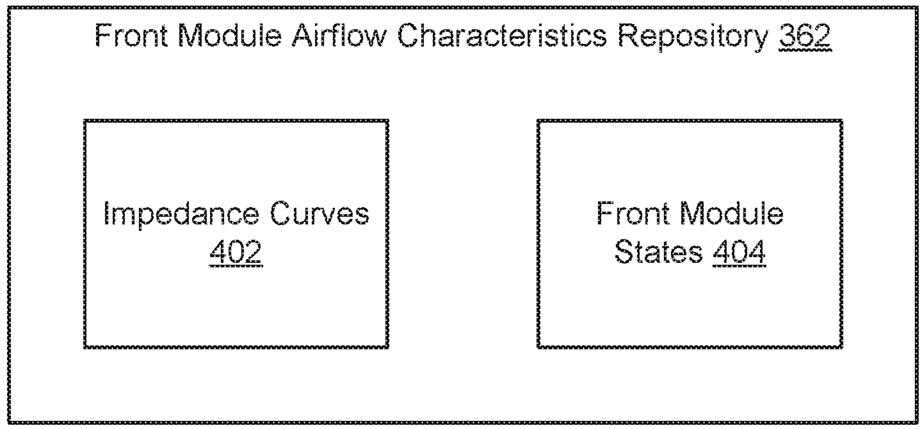
FIG. 4.1
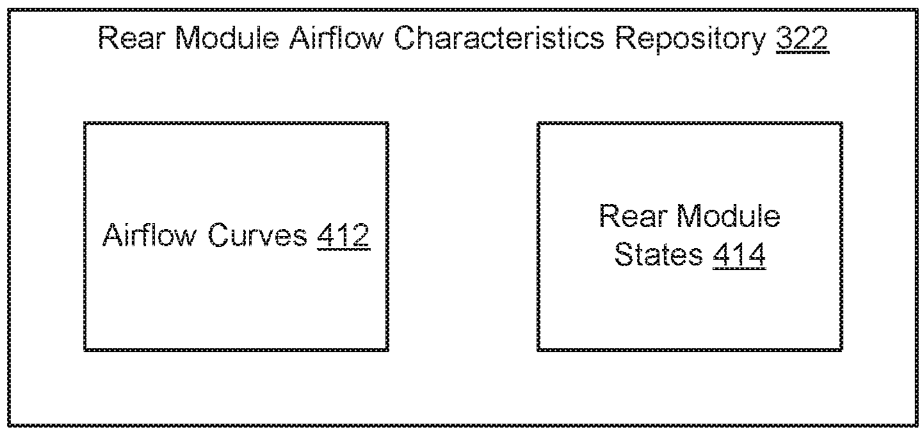
FIG. 4.2

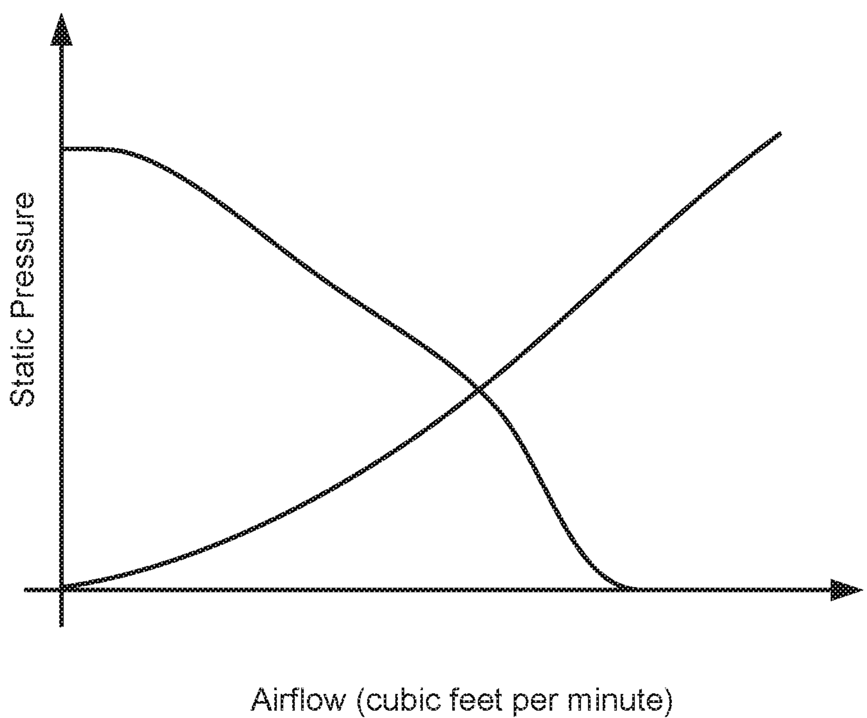
FIG. 4.3
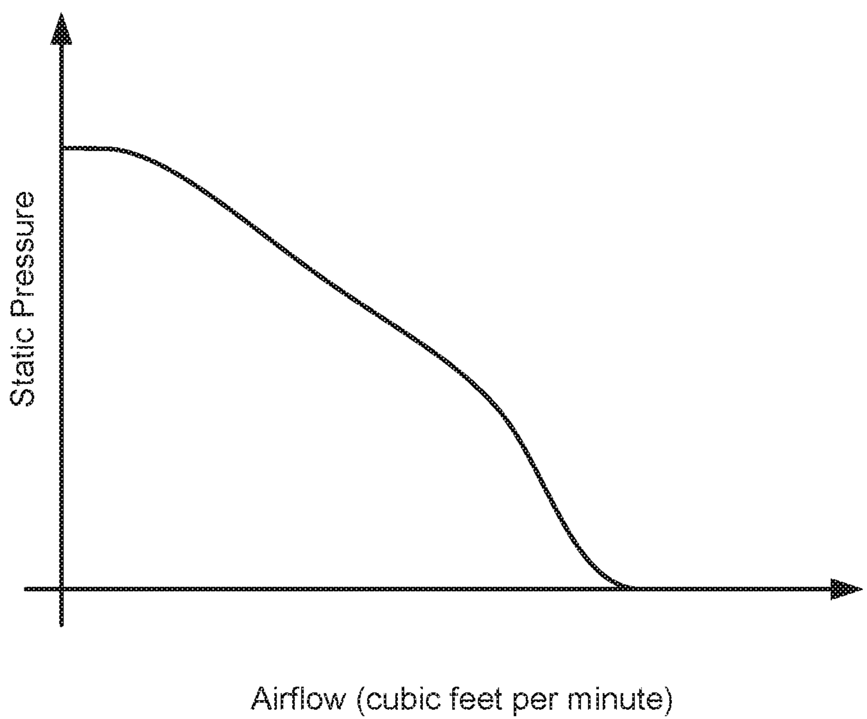
FIG. 4.4

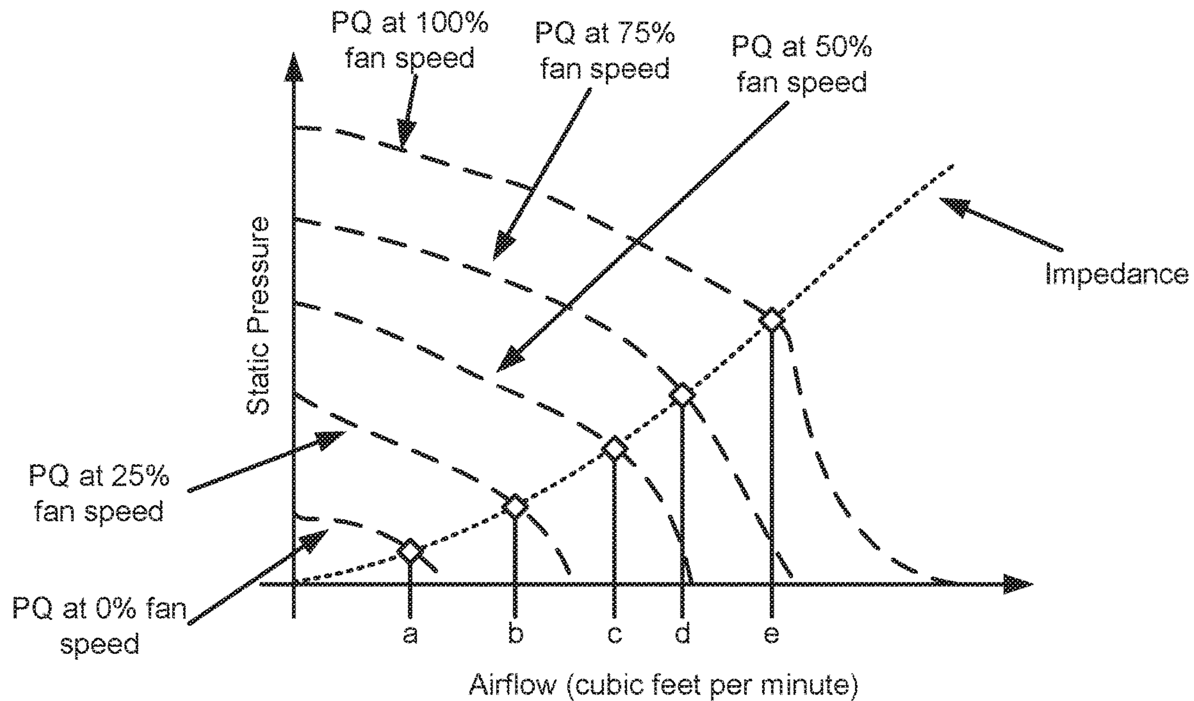
FIG. 4.5
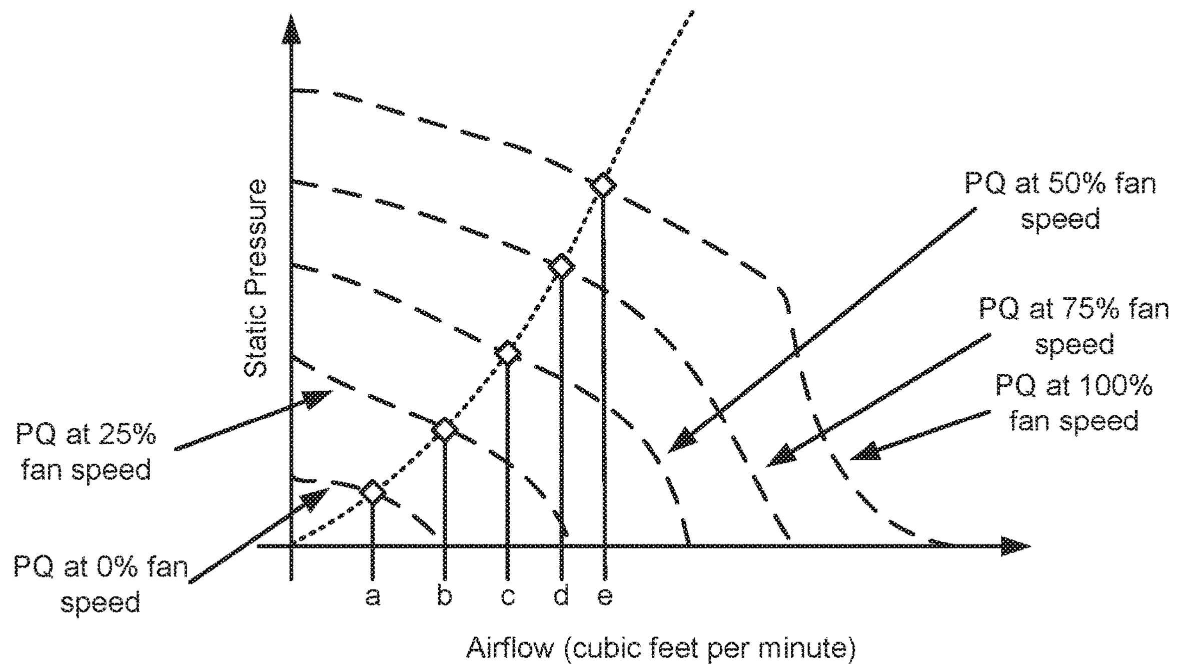
FIG. 4.6

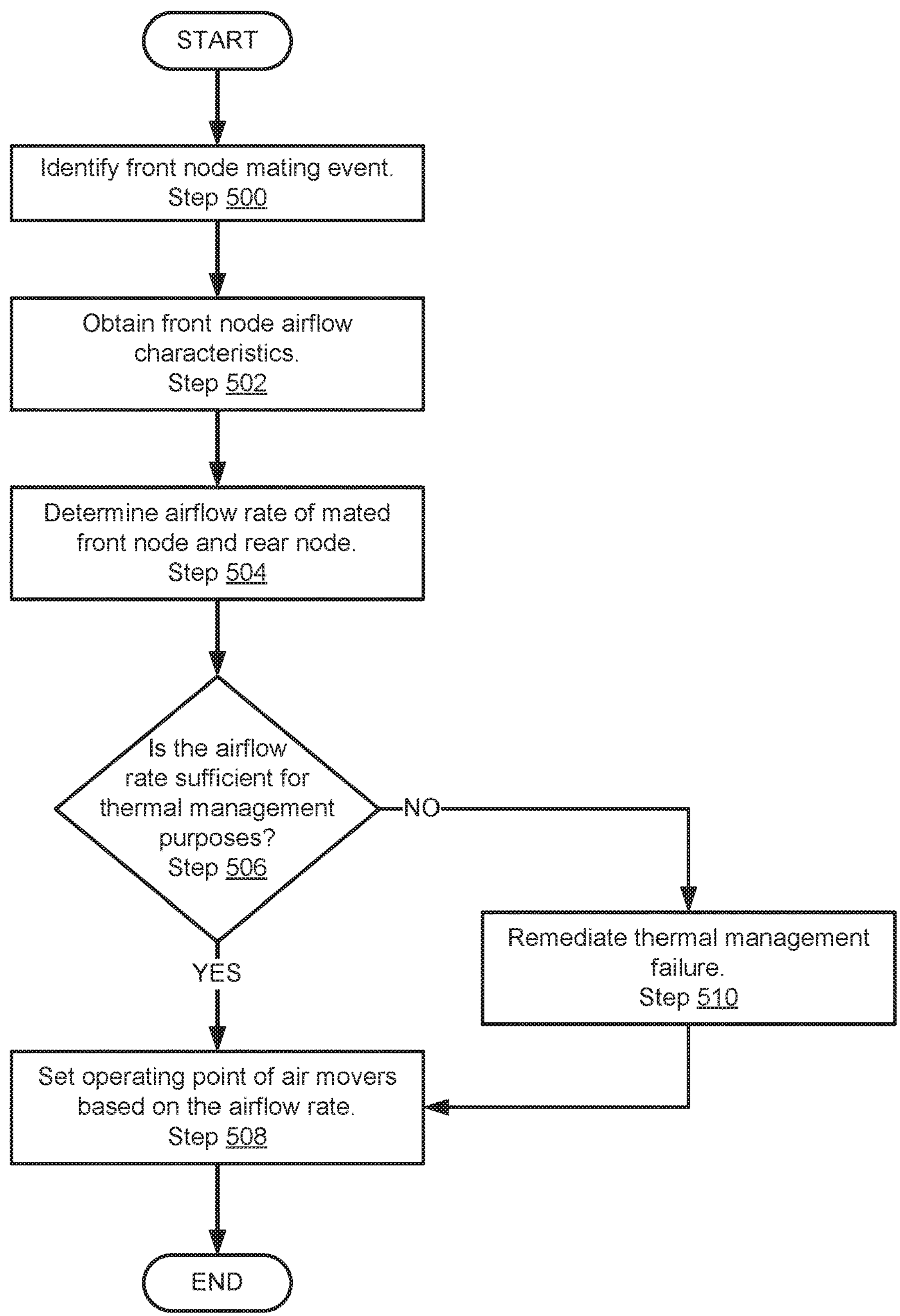
FIG. 5.1

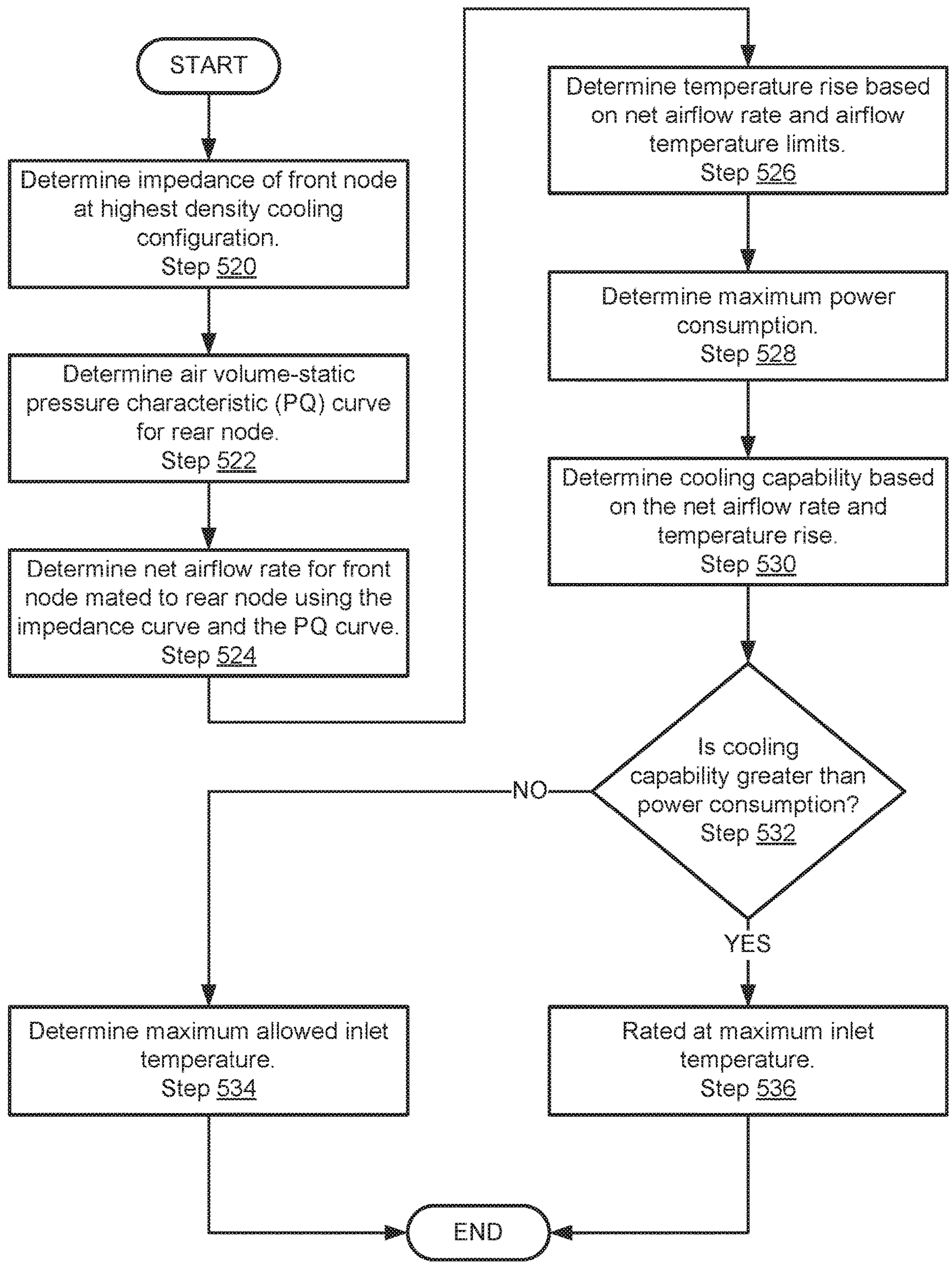
FIG. 5.2

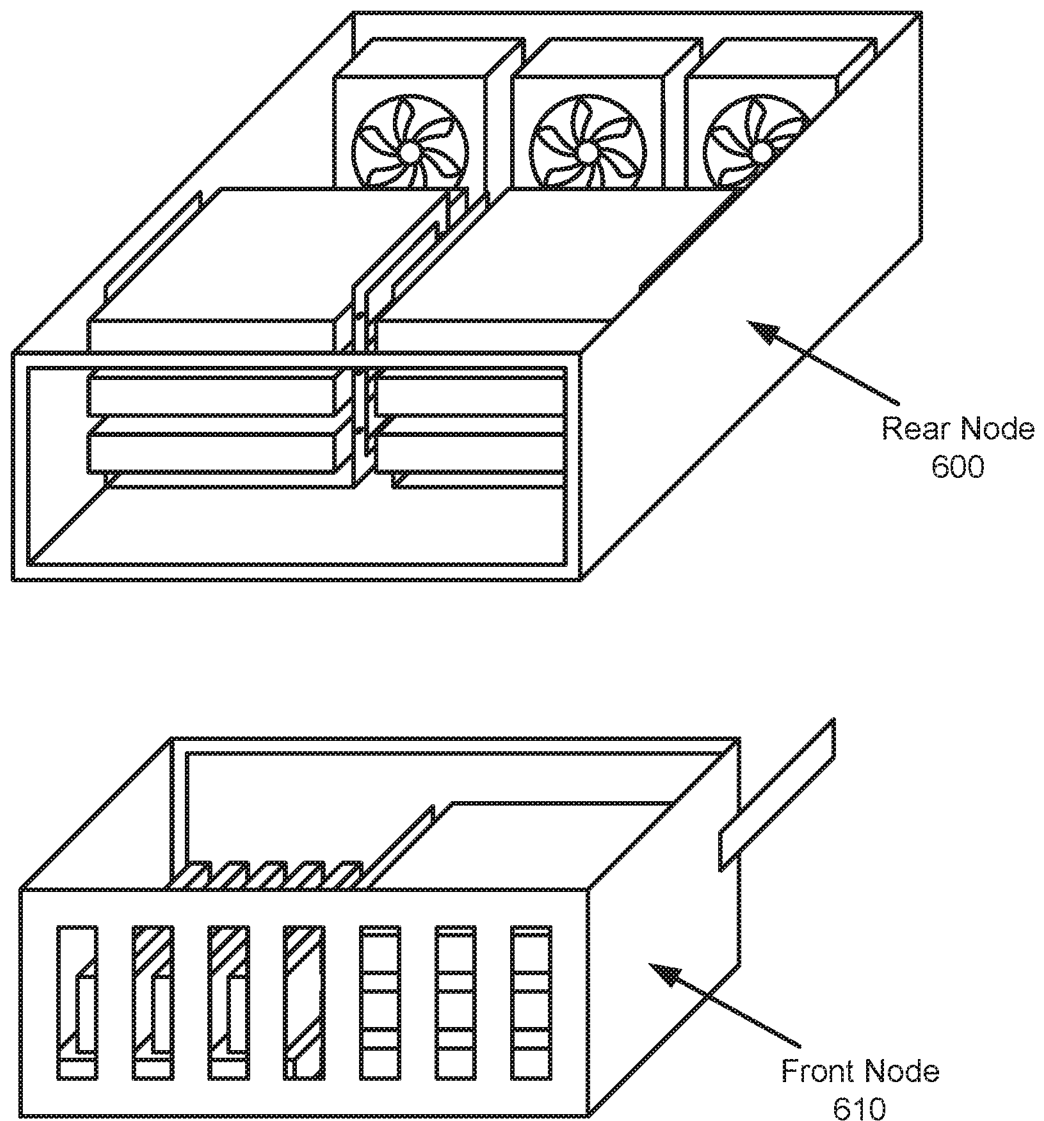
FIG. 6.1

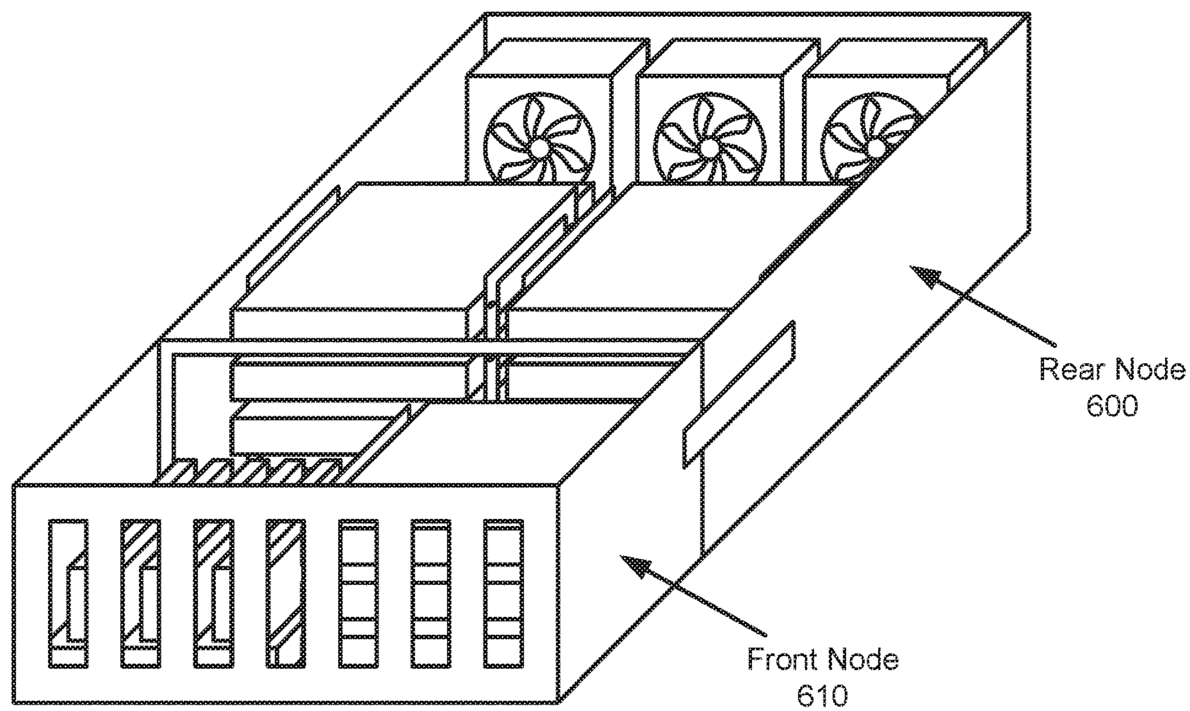
FIG. 6.2

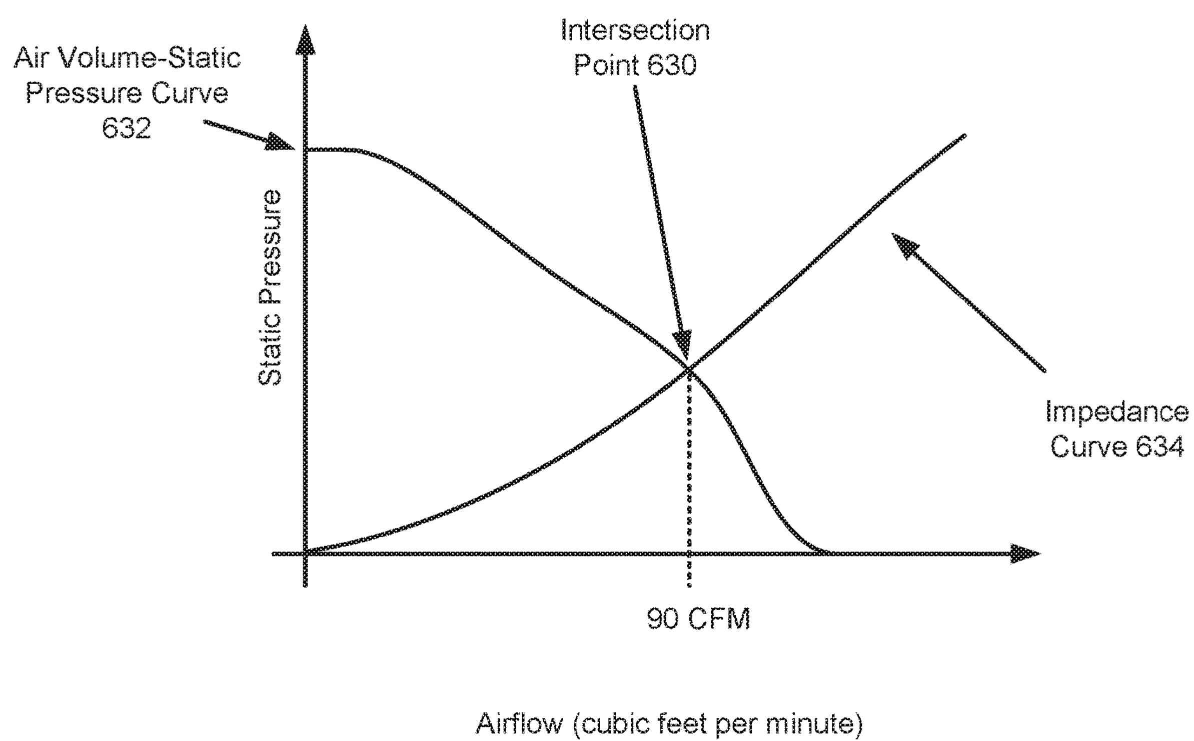
FIG. 6.3

SYSTEM AND METHOD FOR THERMAL CONTROL IN A MODULAR CHASSIS

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack many information handling systems in a vertical arrangement. Due to the changing uses of information handling systems, chassis of information handling systems may modular. That is, a chassis may be composed of multiple enclosures that may be attached to each other to form the chassis of the information handling systems. When the multiple enclosures are attached, components of the information handling system disposed in each of the enclosures may become operably connected to each other.

SUMMARY

In one aspect, an information handling system in accordance with one or more embodiments of the invention includes a rear node that includes an airflow control device a thermal manager. The thermal manager identifies a front node mating event between the rear node and a front node; in response to the front node mating event: obtains front node airflow characteristics for the front node; determines an airflow rate using, at least in part, the front node airflow characteristics; and sets an operating point of the airflow control device based on the airflow rate.

In one aspect, a method for thermally managing an information handling system in accordance with one or more embodiments of the invention includes identifying, by a rear node of the information handling system, a front node mating event between the rear node and a front node; in response to the front node mating event: obtaining front node airflow characteristics associated with the front node; determining an airflow rate using, at least in part, the front node airflow characteristics; and setting an operating point of an airflow control device based on the airflow rate.

In one aspect, a non-transitory computer readable medium in accordance with one or more embodiments of the invention includes computer readable program code, which when executed by a computer processor enables the computer processor to perform a method for thermally managing an information handling system. The method includes identifying, by a rear node of the information handling system, a front node mating event between the rear node and a front node; in response to the front node mating event: obtaining front node airflow characteristics associated with the front node; determining an airflow rate using, at least in part, the front node airflow characteristics; and setting an operating point of an airflow control device based on the airflow rate.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

FIG. 1.1 shows a diagram of a system in accordance with one or more embodiments of the invention.

FIG. 1.2 shows a diagram of a memory device in accordance with one or more embodiments of the invention.

FIG. 1.3 shows a diagram of a storage device in accordance with one or more embodiments of the invention.

FIG. 2.1 shows a top view diagram of the system of FIG. 1.1.

FIG. 2.2 shows an airflow diagram of the system of FIG. 1.1.

FIG. 3.1 shows a diagram of an example thermal manager in accordance with one or more embodiments of the invention.

FIG. 3.2 shows a diagram of an example airflow characteristics manager in accordance with one or more embodiments of the invention.

FIG. 4.1 shows a diagram of a front module airflow characteristics repository in accordance with one or more embodiments of the invention.

FIG. 4.2 shows a diagram of a rear module airflow characteristics repository in accordance with one or more embodiments of the invention.

FIG. 4.3 shows a diagram of an impedance curve in accordance with one or more embodiments of the invention.

FIG. 4.4 shows a diagram of an air volume-static pressure curve in accordance with one or more embodiments of the invention.

FIG. 4.5 shows a diagram of a first example use of air volume-static pressure curves and an impedance curve in accordance with one or more embodiments of the invention.

FIG. 4.6 shows a diagram of a second example use of air volume-static pressure curves and an impedance curve in accordance with one or more embodiments of the invention.

FIG. 5.1 shows a flowchart of a method of providing thermal management services in accordance with one or more embodiments of the invention.

FIG. 5.2 shows a flowchart of a method of preparing a chassis to provide thermal management services in accordance with one or more embodiments of the invention.

FIG. 6.1 shows a diagram of an example system.

FIG. 6.2 shows a diagram of the example system of FIG. 6.1 after two components of the system are attached.

FIG. 6.3 shows a diagram of airflow characteristics of the example system of FIG. 6.1.

DETAILED DESCRIPTION

Figure 7:
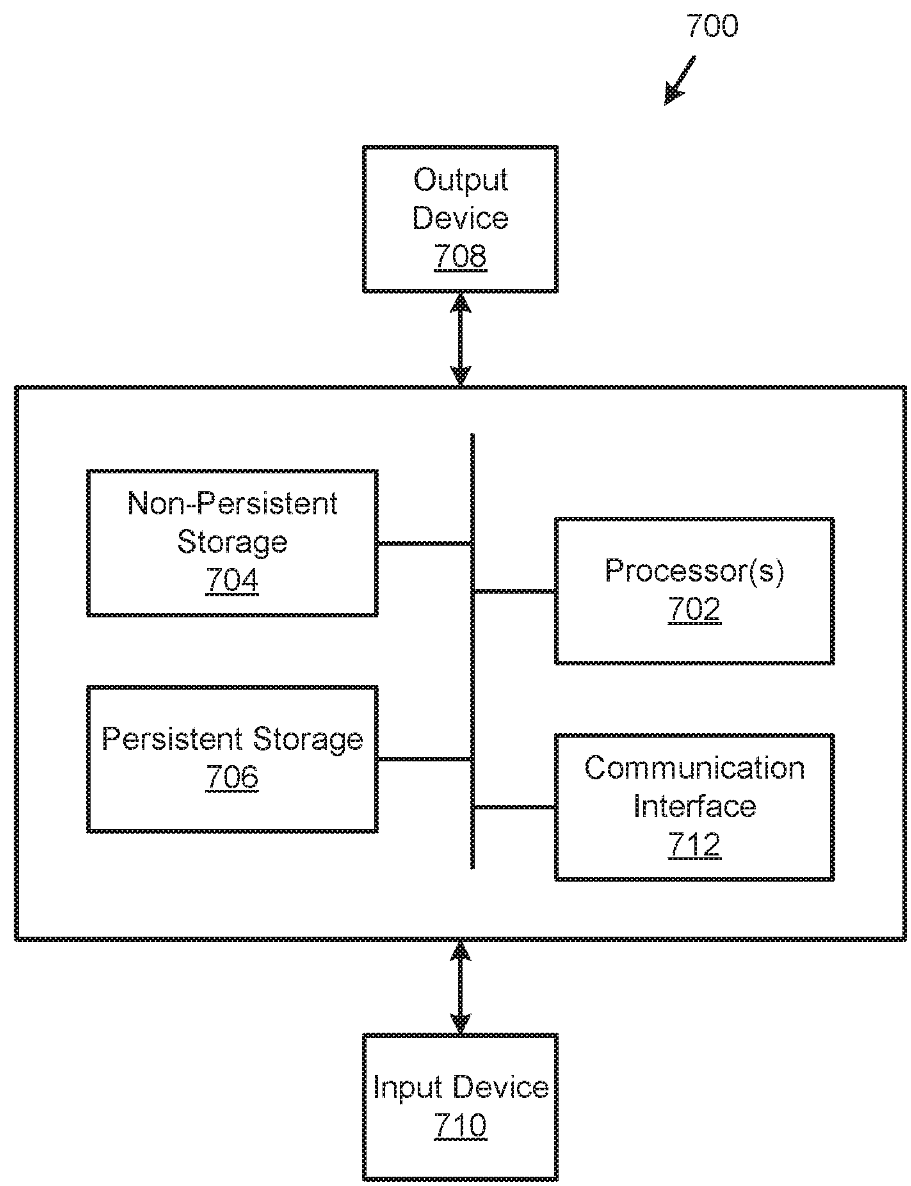
FIG. 7 shows a diagram of a computing device in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for providing thermal management services for information handling systems. More specifically, embodiments of the invention provide a method for providing thermal management services to components disposed within a chassis of an information handling system. For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a computing device such as a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. An example diagram of a computing device is shown in FIG. 7. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

In one or more embodiments of the invention, the thermal manager of a rear node of a chassis obtains airflow characteristics of front node of the chassis. The thermal manager may utilize an open-loop control methodology that utilizes the aforementioned airflow characteristics to set the operating points of one or more airflow control devices disposed within the chassis. By doing so, embodiments of the invention may provide a chassis that is able to determine its capability to provide thermal management services to components disposed within the chassis. Thus, a chassis in accordance with embodiments of the invention may be able to immediately determine whether it has sufficient thermal management capability. In contrast, contemporary methods of providing thermal management services to components within a chassis may rely on a closed-loop control methodology that may not be able to immediately determine whether the chassis has sufficient capability to manage the thermal state of components disposed within the chassis.

In one or more embodiments of the invention, a front node of a chassis is modeled as an airflow impedance curve and a rear node of chassis is treated as an air volume-static pressure characteristic (PQ) curve. A thermal manager of the chassis may identify an intersection between these curves and set the operating point of airflow control devices of the chassis based on an airflow rate associated with the intersection point.

FIG. 1 shows an information handling system (1) in accordance with one or more embodiments of the invention. The information handling system (1) may include a chassis (10) for housing electronic components. The chassis (10) may be a physical structure such as, for example, a rectangular housing. The chassis (10) may be adapted for mounting in a multi-chassis storage architecture such as, for example, a rack. The chassis (10) may include mounting hardware (not shown) such as, for example, rails, brackets, rollers, or other physical structures for subtly attaching the chassis (10) to the multi-chassis storage architecture.

In one or more embodiments of the invention, the chassis (10) includes a front node (100) and a rear node (130). The nodes may be separate physical devices for housing payloads (e.g., 104, 134). The nodes may be, for example, rectangular housings. The payloads (e.g., 104, 134) may include electronic components for performing computations. For additional details regarding payloads, refer to FIGS. 1.2-1.3.

The front node (100) may be reversibly attached to the rear node (130) via a node interface (150). For example, the front node (100) in the rear node (130) may include mounting hardware (160) such as, for example, latches, brackets, or other mechanical attachment hardware that enables the front node (100) and rear node (130) to be mechanically attached to each other.

When the front node (100) is attached to the rear node (130) an airflow path may be formed throughout the interior of the nodes that enables heat from the payloads (e.g., 104, 134) to be dissipated. By doing so, the payloads (e.g., 104, 134) may be thermally regulated within a predetermined temperature range by dissipating heat generated by the payloads via airflow that traverses the airflow path. For additional regarding heat dissipation via airflow, refer to FIGS. 2.1-2.2.

To facilitate airflow via the airflow path through the chassis (10), the front node (100) may include a front air exchange (102) and the rear node (130) may include a rear air exchange (132). These air exchanges may be physical devices that enable air to be exchanged with an exterior environment surrounding the chassis (10). For example, the front air exchange (102) may include openings on an exterior surface of the front node (100). The rear air exchange (132) may also include openings on an exterior surface of the rear node (130). These air exchanges may facilitate the flow of air from an ambient environment surrounding the chassis (10), through the chassis (10), and back into the ambient environment. By doing so, air having a temperature of the ambient environment may be obtained, used to dissipate heat from the payloads (e.g., 104, 134), and exhausted back into the ambient environment.

To control, generate, or otherwise manage airflow within the chassis (10), air movers (136), i.e., airflow control devices, may be disposed within the chassis (10). For example, the air movers (136) may be disposed near one of the air exchanges. The air movers (136) may be physical devices that manage airflow within the chassis (10). For example, the air movers (136) may be fans. The fans may be disposed within the chassis (10) at predetermined locations. For example, the fans may be disposed proximate to the rear air exchange (132). When the fans are active, the fans may generate an airflow within chassis (10). By doing so, the fans may control dissipation of heat generated by the payloads (e.g., 104, 134). As will be discussed in greater detail below, the air movers (136) may be operably controlled by a thermal manager that manages a thermal state of the chassis (10). For additional details regarding management of the thermal state of the chassis (10), refer to FIGS. 2.1-2.2.

As discussed above, the chassis (10) may include payloads that generate heat. For example, the payloads may include components of a computing device housed by the chassis (10). The computing device may be, for example, a server, computing node of a cluster, or other type of computing device for providing computing services. For additional details regarding computing devices, refer to FIG. 7.

Payloads may include any number of computing components that provide any time of computing service. For example, the computing components may be processors, memory modules, storage modules, etc. FIGS. 1.2-1.3 show diagrams of examples of portions of payloads in accordance with one or more embodiments of the invention.

FIG. 1.2 shows a diagram of a first portion of a payload in accordance with one or more embodiments of the invention. The first portion of the payload includes memory devices (170) operatively connected to a controller (172). The memory devices (170) may be, for example, dual inline memory modules. The controller (172) may be, for example, a memory controller.

FIG. 1.3 shows a diagram of a second portion of a payload in accordance with one or more embodiments of the invention. The second portion of the payload includes storage devices (180) operatively connected to a frame (182). The storage devices (180) may be, for example, hard disk drives, solid state drives, or other types of digital storage devices. The frame (182) may be, for example, a bracket for physically mounting any number of storage devices (180).

As shown in FIGS. 1.2-1.3, portions of the payloads may include computing components (e.g., 170, 180) that provide different types of computing services. For example, the memory devices (170) may provide memory services while the storage devices (180) may provide storage services. Different types of portions of payloads may provide any type of computing services, e.g., processing, memory, storage, communication, etc. When providing such services, the portions of payloads may generate heat which may need to be dissipated or otherwise removed for the portions of the payloads to continue to operate. For example, each of the portions of the payloads may have a predetermined operating temperature range which, if exceeded, may cause the portions of the payloads to fail to operate.

In one or more embodiments of the invention, the chassis may provide thermal dissipation services to payloads disposed in the chassis. FIGS. 2.1-2.2 show top view diagrams of a chassis in accordance with one or more embodiments of the invention.

FIG. 2.1 shows a top view diagram of a chassis in accordance with one or more embodiments of the invention. The chassis may be similar to the chassis illustrated in FIGS. 1.1-1.2. The components of the chassis illustrated in FIG. 2.1 having been similar names or numbering to the components of the chassis illustrated in FIGS. 1.1-1.2 may be similar.

As discussed with respect to FIGS. 1.1-1.2, the chassis may provide thermal management services to components of the front node payload (104) and/or components of the rear node payload (134). To do so, an airflow within the chassis may be generated to dissipate heat generated by the payloads. For additional details regarding the airflow within the chassis, refer to FIG. 2.2.

To provide thermal management services, the rear node (130) may include a thermal manager (208). The thermal manager may control the airflow within the chassis. To control airflow within the chassis, the thermal manager (208) may set an operating point of air movers (136) and/or other airflow control devices disposed within the chassis. By controlling the operating point of the air movers (136) and/or other airflow control devices the rate of airflow within the chassis may be controlled. For additional details regarding the thermal manager (208), refer to FIG. 3.1.

An operating point may be a duty cycle, rate, or other characteristic of an air mover or other airflow control device that impacts the rate of airflow through the chassis. For example, an operating point of a fan may be the rate of rotation of the blades of the fan.

While FIG. 2.1 is illustrated as only including air movers (136) as airflow control devices, a chassis in accordance with embodiments of the invention may include different, additional, and/or fewer airflow control devices without departing from the invention. Additionally, the airflow control devices may be disposed at different locations than as illustrated in FIG. 2.1 without departing from the invention.

For example, consider a scenario in which a chassis doesn't include any air movers (136) but includes an airflow control valve. In such a scenario, a front ventilation source (210) may be at a high pressure and a rear ventilation source (212) may be at a low pressure, i.e., lower than the pressure of the front ventilation source (210). In such a scenario, an airflow through the chassis may be generated due to the difference in air pressure and may be directed into the front node and out of the rear node. The airflow control valve may be operably connected to and actuatable by the thermal manager (208). Thus, by actuating the airflow control valve the thermal manager (208) may control the rate of airflow through the chassis by modulating the impedance to the airflow presented by the airflow control valve.

As noted above, the front node (100) and the rear node (130) may be separate physical devices. When the front node (100) is mated to the rear node (130), the airflow through each of these nodes may be linked. That is, the rate of airflow through both the front node (100) and the rear node (130) may depend on the airflow characteristics of both of the nodes.

For example, consider a scenario in which the rear node (130) is not mated to a front node (100). In this configuration, the rate at which air flows through the rear node (130) for a particular operating point of the air movers (136) is different from the rate at which air flows through the rear node (130) when the front node (100) is mated to the rear node (130) and the air movers (136) operating at the same operating point.

In other words, mating a front node (100) to a rear node (130) may present an impedance to the flow of air through the rear node (130) and thereby decrease the airflow rate through the rear node (130). Depending on the configuration of the front node (100), i.e., the composition of the front node payload (104), the front node (100) may present different impedances to the rear node (130).

In one or more embodiments of the invention, the front node (100) includes an airflow characteristics manager (206). Airflow characteristics manager (206) may be programmed to notify a thermal manager of the rear node which the front node mates of airflow characteristics of the front node (100). By doing so, the front node (100) may provide the rear node (130) with information that the rear node (130) may utilize to thermally manage both the front node (100) and the rear node (130). For additional details regarding the airflow characteristics manager (206), refer to FIG. 3.2.

Turning to FIG. 2.2, FIG. 2.2 shows an airflow diagram of the chassis illustrated in FIG. 2.1. For clarity, a portion of the element numbering of the components of the included in the chassis have been removed when compared to FIG. 2.1.

In FIG. 2.2, airflow is illustrated by arrows having dashed and wavy tales. As seen in FIG. 2.2, an airflow is present within the interior of the chassis. Specifically, the airflow is directed from the front ventilation source (210), through the chassis, and out into the rear ventilation source (212). The airflow could be directed in the reverse direction without departing from the invention.

This airflow may enable heat generated by components disposed in the chassis to be dissipated. For example, as computing components such as, for example, processors, memory modules, storage modules, and/or communication modules operate the aforementioned components may generate heat as a byproduct of their operation. When the airflow passes near these components, heat from the components may be exchanged with the airflow and thereby dissipated. The airflow may cause the heat to be exhausted into the environment surrounding the chassis. In this manner, the temperature of components disposed within the chassis may be regulated.

To regulate the temperature of the components, the rate of the airflow may be modulated. However, there may be limits upon the rate of the airflow. For example, as the rate of airflow increases, the quantity of energy required to generate the airflow may also increase. Accordingly, there may be an operating point for air movers or other airflow control devices that balances the amount of heat dissipation caused by the airflow versus the quantity of energy used to generate the airflow.

This operating point may be highly dependent upon the impedance to the flow of air caused by components disposed within the chassis. Thus, when different front modules that house different payloads are mated with a rear node, the operating point may be different.

Further, depending on the components included in each of the nodes, the quantity of thermal dissipation necessary to regulate a temperature of the components may be different. Consequently, the operating point of the air movers or other airflow control devices may vary depending on the thermal dissipation needs of the components included in the nodes.

Additionally, depending on the temperature of the air obtained from the ventilation sources, the amount of thermal dissipation that may be provided by a particular rate of airflow may vary. Consequently, the operating point of the air movers or other airflow control devices may vary also depending on the temperature of the air from the ventilation sources.

As noted above, a thermal manager (e.g., 300) may manage the rate of airflow within a chassis thereby managing the thermal state of components disposed within the chassis. FIG. 3.1 shows a diagram of an example thermal manager (300) in accordance with one or more embodiments of the invention.

The example thermal manager (300) may be implemented as a physical or virtual device. For example, the example thermal manager (300) may be a physical device comprising circuitry. The circuitry may be adapted to provide the functionality of the example thermal manager (300) described throughout this application. The example thermal manager (300) may be an application integrated specific circuit, a programmable gate array, or other type of programmable logic device. In another example, the example thermal manager (300) may be implemented as code, i.e., software instructions, stored on a non-transitory computer readable media that when executed by a processor cause the processor to perform the functionality of the example thermal manager (300). The example thermal manager (300) may be implemented via other technologies without departing from the invention.

The example thermal manager (300) may provide thermal management services to components disposed within the chassis. The thermal management services may include management of the flow of air throughout chassis. By doing so, the example thermal manager (300) may manage the thermal state of components disposed within the chassis. To provide the aforementioned functionality, the example thermal manager (300) may include an airflow manager (310) and a persistent storage (320). Each component of the example thermal manager (300) discussed below.

The airflow manager (310) may manage the operating points of any number of airflow control devices. For example, the airflow manager (310) may manage the operating point of air movers disposed within the chassis. The operating point of each airflow control device may control the manner in which the airflow control device modulates airflow within the chassis.

For example, with respect to an air mover, the operating point of the air mover may control the amount of power used by the air mover to cause air to flow. In a scenario in which the air movers a fan, controlling the amount of power used by the fan may modulate rotational rate of the blades of the fan and thereby change the rate of the flow of air caused by the fan. By managing the airflow rate within the chassis, the airflow manager (310) may dissipate heat from components disposed within the chassis and thereby manage a thermal state of each of the components, e.g., limit the temperature of each component within a predetermined range.

In one or more embodiments of the invention, the airflow manager (310) implements an open-loop control scheme for managing the operating points of each of the airflow control devices. An open-loop control scheme may not use feedback to control the operating points of the airflow control devices. For example, a closed loop control scheme may monitor the temperature of components disposed within the chassis and control the operating point of the airflow control devices to regulate the temperature of the components based on the temperature of the components. In contrast, an open-loop control scheme may not use feedback regarding the temperature or other characteristics of the to be regulated components when setting an operating point of each of the airflow control devices.

In one or more embodiments of the invention, the airflow manager (310) manages the operating points of each of the airflow control devices based on: (i) airflow characteristics of a rear node of the chassis and (ii) airflow characteristics of a front node of the chassis. The airflow manager (310)

may perform all, or a portion, of the method illustrated in FIG. 5.1 when managing the operating points of each of the airflow control devices.

In one or more embodiments of the invention, the airflow characteristics of the front node of the chassis is an airflow impedance curve associated with the front node. An impedance curve may represent the impedance to the flow of air presented by an object such as a node. In one or more embodiments of the invention, the airflow characteristics of the rear node of the chassis is an air volume-static pressure characteristic curve associated with the rear node. An air volume-state pressure characteristic curve may represent the relationship between the air volume and the state pressure resulting from loss due to the pressure applied to the inlet and outlet of an object, i.e., a fan curve, such as a rear node that includes active airflow control devices such as fans.

In one or more embodiments of the invention, the airflow manager (310) obtains the airflow characteristics of the front node from an airflow characteristic manager of the front node. For example, when a front node rates of the rear node, the airflow manager (310) may obtain the airflow characteristics of the front node from the airflow characteristics manager via an operable connection. The operable connection may be formed in any manner and may utilize any number of wired and/or wireless connections and/or networks. Upon obtaining the airflow characteristics of the front node, the airflow manager (310) may store the obtained characteristics in persistent storage (320) in a mated front module airflow characteristics repository. For additional details regarding the mated front module airflow characteristics repository, refer to FIG. 4.1.

In one or more embodiments of the invention, the persistent storage (320) is a physical device for storing digital data. The persistent storage (320) may include any number of physical components for storing digital data. The physical components may be, for example, hard disk drives, solid state drives, tape drives, and/or other digital storage devices.

The persistent storage (320) may store data structures used by the airflow manager (320) and/or other entities hosted by the example thermal manager (300). In one or more embodiments of the invention, the persistent storage (320) stores a rear module airflow characteristics repository (322), air movers operating points (324), and/or a mated front module airflow characteristics repository (326). Each of these data structures is discussed below.

The rear module airflow characteristics repository (322) may be a data structure that stores information regarding the airflow characteristics of a rear module. The airflow characteristics of the rear module may be used by the airflow manager (310) when setting operating points of air movers disposed within a rear module. For additional details regarding the rear module airflow characteristics repository (322) refer to FIG. 4.2.

The air movers' operating points (324) may be a data structure that stores information regarding the operating points of one or more air movers of a rear chassis. For example, the air movers operating points (324) may specify the duty cycle, power consumption rate, or other characteristic of an air mover that controls the rate at which an air mover generates an airflow. The air movers operating points (324) include any number of operating points for any number of air movers without departing from the invention. The air movers operating points (324) may be set by the airflow manager (310).

The mated front module airflow characteristics repository (326) may be a data structure that stores information regarding airflow characteristics of a front module. The airflow characteristics of the front module may be used by the airflow manager (310) when setting operating points of air movers disposed within a rear module. For additional details regarding the mated front module airflow characteristics repository (326), refer to FIG. 4.1.

While the persistent storage (320) has been illustrated and described as including a number of discrete data structures, the persistent storage (320) may store additional, different, and/or fewer data structures without departing from the invention. Additionally, while the data structures of the persistent storage (320) have been illustrated as discrete data structures, the content of these data structures may include additional information, different information, and/or less information without departing from the invention.

While the example thermal manager (300) has been illustrated as including a limited number of components, an example thermal manager (300) in accordance with one or more embodiments of the invention may include additional, different, and/or fewer components without departing from the invention.

As noted above, an airflow characteristics manager of a front node may provide airflow characteristics of the front node to other entities when the airflow characteristics are requested. FIG. 3.2 shows a diagram of an example airflow characteristics manager (350) in accordance with one or more embodiments of the invention.

The example airflow characteristics manager (350) may be implemented as a physical or virtual device. For example, the example airflow characteristics manager (350) may be a physical device comprising circuitry. The circuitry may be adapted to provide the functionality of the example airflow characteristics manager (350) described throughout this application. The example airflow characteristics manager (350) may be an application integrated specific circuit, a programmable gate array, or other type of programmable logic device. In another example, the example airflow characteristics manager (350) may be implemented as code, i.e., software instructions, stored on a non-transitory computer readable media that when executed by a processor cause the processor to perform the functionality of the example airflow characteristics manager (350). The example airflow characteristics manager (350) may be implemented via other technologies without departing from the invention.

The example airflow characteristics manager (350) may be programmed to provide airflow characteristics of the front node hosting the example airflow characteristics manager (350). For example, the example airflow characteristics manager (350) may provide the airflow characteristics of the front node to a thermal manager of a rear node after the front node is mated to the rear node. By doing so, front node may notify a rear node of its airflow characteristics when mated to the rear node. Consequently, the rear node may take into account airflow characteristics of the front node when setting the operating points of one or more airflow control devices. For example, the rear node may set the operating point of an airflow control device to ensure that in airflow within a chassis is sufficient to provide thermal management to components disposed within the chassis.

To provide the aforementioned functionality of the example airflow characteristics manager (350), the example airflow characteristics manager (350) may include characteristics manager (352) and a persistent storage (360). Each of these components of the example airflow characteristics manager (350) is discussed below.

In one or more embodiments of the invention, the characteristics manager (352) manages a front module airflow characteristics repository (362). The characteristics manager (352) may manage the front module airflow characteristics repository (362) by providing information stored in the repository to a thermal manager upon the occurrence of a predetermined event. The predetermined event may be, for example, when a front node hosting the example airflow characteristics manager (350) is mated with rear node. Alternatively, the predetermined event may be when the example airflow characteristics manager (350) receives a request from a thermal manager for the airflow characteristics of a front node hosting the example airflow characteristics manager (350). The predetermined event may be other types of events without departing from the invention. To provide the aforementioned functionality of the characteristics manager (352), the characteristics manager (352) may perform all or a portion of the methods illustrated in FIGS. 5.1-5.2.

In one or more embodiments of the invention, the persistent storage (360) is a physical device for storing digital data. The persistent storage (360) may include any number of physical components for storing digital data. The physical components may be, for example, hard disk drives, solid state drives, tape drives, and/or other digital storage devices.

The persistent storage (360) may store data structures used by the characteristics manager (352) and/or other entities hosted by the example airflow characteristics manager (350). In one or more embodiments of the invention, the persistent storage (360) stores a front module airflow characteristics repository (362).

The front module airflow characteristics repository (362) may be a data structure that stores information regarding airflow characteristics of a front module. The airflow characteristics of the front module may be used by the characteristics manager (352) to provide a thermal manager or other entity with information regarding the airflow characteristics of a front module. The front module airflow characteristic repository (362) may be populated based on the components disposed within a front module. As discussed above, the airflow characteristics of the front module may depend on the components included in the front module. For additional details regarding the front module airflow characteristics repository (362), refer to FIG. 4.1.

While the persistent storage (360) has been illustrated and described as including a number of discrete data structures, the persistent storage (360) may store additional, different, and/or fewer data structures without departing from the invention. Additionally, while the data structures of the persistent storage (360) have been illustrated as discrete data structures, the content of these data structures may include additional information, different information, and/or less information without departing from the invention.

While the example airflow characteristics manager (350) has been illustrated as including a limited number of components, an example airflow characteristics manager (350) in accordance with one or more embodiments of the invention may include additional, different, and/or fewer components without departing from the invention.

To further clarify embodiments of the invention, diagrams of data structures that may be utilized by components of the system illustrated in FIG. 1.1 are shown in FIGS. 4.1-4.2.

FIG. 4.1 shows a diagram of a front module airflow characteristics repository (362) in accordance with one or more embodiments of the invention. As noted above, the front module airflow characteristics repository (362) may include information regarding airflow characteristics of a front module. The front module airflow characteristics repository (362) may include impedance curves (402) and front module states (404).

The impedance curves (402) may specify the relationship between the impedance presented by a front module for different airflow rates of airflow through the front module. For example, an impedance curve may specify the impedance the flow of air presented by a front node over a range of airflow rates through the front node for a given internal configuration of the front node. Generally, for front nodes that only include passive airflow devices, the impedance presented by a front node increases as the airflow rate increases.

In one or more embodiments of the invention, an impedance curve specifies a static pressure for the front node for a range of airflow rates. For example, an impedance curve may specify the static pressure for the front node for a range of airflow from 0 cubic feet per minute up to 300 feet per minute. Other ranges may be used without departing from the invention. An example diagram of an impedance curve is provided in FIG. 4.3. The impedance curves (402) may include any number of impedance curves associated with any number of configuration states of a front node, discussed below, without departing from the invention.

The front module states (404) may specify configuration states for a front module that corresponds to each of the impedance curves (402). For example, front module states (404) may specify the components of a front module that were in the front module when an associated impedance curve of the impedance curves (402) was generated. The front module states (404) may include any number of configuration states for any number of corresponding impedance curves without departing from the invention.

Additionally, while not illustrated in FIG. 4.1, the front module airflow characteristics repository (362) may include additional information that may be used by a thermal manager to set the operating points of airflow devices. For example, the front module airflow characteristics repository (362) may specify a required airflow rate necessary to meet thermal dissipation requirements of the components specified by a corresponding configuration state of a front module. In another example, the front module airflow characteristics repository (362) may specify temperatures of the airflows associated with the required airflow rate necessary to meet thermal dissipation requirements of the components specified by a corresponding configuration state of a front module. Such information may be used by a thermal manager to set an operating point of airflow control devices to ensure that an airflow sufficient to meet the thermal dissipation requirements of the components disposed in the front module is present throughout a chassis.

FIG. 4.2 shows a diagram of a rear module airflow characteristics repository (322) in accordance with one or more embodiments of the invention. As noted above, the rear module airflow characteristics repository (322) may include information regarding airflow characteristics of a rear module. The rear module airflow characteristics repository (322) may include airflow curves (412) and rear module states (414).

The airflow curves (412) may specify the relationship between the static pressure presented by a rear module for different airflow rates of airflow through the rear module. For example, an airflow curve may specify the static pressure presented by a rear node over a range of airflow rates through the rear node for a given internal configuration of the rear node. Generally, the static presented by a rear node may decrease as an airflow rate increases when an airflow is generated by an active airflow control device, i.e., an air mover, is present in the rear node.

In one or more embodiments of the invention, an airflow curve specifies a static pressure for the rear node for a range of airflow rates. For example, an airflow curve may specify the static pressure for the rear node for a range of airflow from 0 cubic feet per minute up to 300 feet per minute. Other ranges may be used without departing from the invention. An example diagram of an airflow curve is provided in FIG. 4.4. The airflow curves (412) may include any number of airflow curves associated with any number of configuration states of a rear node, discussed below, without departing from the invention.

For example, the static pressure for the rear node may be characterized when airflow control devices are operated at different duty cycles or rates. The different duty cycles or rates may be operated at discrete rates over all or a portion of their total range. For example, a fan used as an airflow control device may be operated at 0%, 25%, 50%, 75%, and 100%. When operated at each of these rates, the static pressure of the rear node may be determined over the range of airflow rates. The airflow control device may be operated at different levels of discretization and corresponding curves for each operating point may be generated. For examples of using such curves in combination with impedance curves, refer to FIGS. 4.5-4.6.

The rear module states (414) may specify configuration states for a rear module that corresponds to each of the airflow curves (412). For example, rear module states (414) may specify the components of a rear module that were in the rear module when an associated airflow curve of the airflow curves (412) was generated. The rear module states (414) may include any number of configuration states for any number of corresponding airflow curves without departing from the invention.

Additionally, while not illustrated in FIG. 4.2, the rear module airflow characteristics repository (322) may include additional information that may be used by a thermal manager to set the operating points of airflow devices. For example, the rear module airflow characteristics repository (322) may specify a required airflow rate necessary to meet thermal dissipation requirements of the components specified by a corresponding configuration state of a rear module. In another example, the rear module airflow characteristics repository (322) may specify temperatures of the airflows associated with the required airflow rate necessary to meet thermal dissipation requirements of the components specified by a corresponding configuration state of a rear module. Such information may be used by a thermal manager to set an operating point of airflow control devices to ensure that an airflow sufficient to meet the thermal dissipation requirements of the components disposed in the rear module is present throughout a chassis.

To further clarify embodiments of the invention, FIGS. 4.3-4.6 illustrate relationships that may be utilized by components of FIG. 1.1. For example, FIGS. 4.3-4.4 illustrate examples of individual relationships that may be utilized when setting operating points of airflow control devices while FIGS. 4.5-4.6 illustrate examples of multiple relationships that may be utilized when setting operating points of airflow control devices.

FIG. 4.3 shows a diagram of a front node impedance curve in accordance with one or more embodiments of the invention. The front node impedance curve may specify impedance, i.e., a static pressure, presented by a front node for a given airflow rate through the front node.

For example, in FIG. 4.3 the front node impedance curve is illustrated as a two-dimensional plot where the airflow rate through an example front node is presented along the horizontal axis. The corresponding impedance presented by the front node is illustrated along the vertical axis. As seen from the plot, the impedance increases as the rate of airflow through the front node increases.

FIG. 4.4 shows a diagram of a rear node airflow curve in accordance with one or more embodiments of the invention. The rear node airflow curve may specify static pressure presented by a rear node for a given airflow rate through the rear node.

For example, in FIG. 4.4 the rear node airflow curve is illustrated as a two-dimensional plot where the airflow rate through an example rear node is presented along the horizontal axis. The corresponding static pressure presented by the front node is illustrated along the vertical axis. As seen from the plot, the impedance decreases as the rate of airflow through the rear node increases.

As will be discussed in greater detail below, such curves as illustrated in FIGS. 4.3-4.4 may be used by a thermal manager to set the operating point of airflow control devices within a chassis with respect to FIGS. 4.5-4.6.

To further clarify the use of PQ curves associated with rear nodes in combination with impedance curves associated with front nodes, examples of such curves are illustrated in FIGS. 4.5-4.6. FIGS. 4.5-4.6 show diagrams of PQ curves and respective impedance curves plotted together. In the figures, the horizontal axis represents airflow through an information handling system including a front node that is mated to a rear node. The vertical axis represents the static pressure of the information handling system. In each plot, lines with short dashing represent the impedance of the front node. In contrast, lines with long dashing represent the PQ curve of a rear node at different fan speeds of airflow control devices of the rear node.

As seen in the figures, the impedance curve intersects with the various PQ curves at different locations. The horizontal axes location corresponding to each curve (marked by the labeled drop down lines as a, b, c, d, and e) represents a predicted airflow rate through the information handling device at these fan operating points. In other words, when the fan of the information handling system is operated at 100% a predicted airflow rate denoted by drop down line e is predicted, when the fan of the information handling system is operated at 75% a predicted airflow rate denoted by drop down line d is predicted, when the fan of the information handling system is operated at 50% a predicted airflow rate denoted by drop down line c is predicted, etc.

Thus, when a thermal manager of a rear node is mated to a front node, the thermal manager may obtain an impedance curve from the front node. The impedance curve may then be used in combination with PQ curves associated with different fan speeds to identify the intercepts between the curves. Each intercept location is associated with a predicted airflow rate through the information handling system in the mated condition of the front node to the rear node. In this manner, the thermal manager may use an open loop control method to set a fan speed rate (or duty cycle/rate of another type of airflow control device) to generate a predetermine airflow rate. The airflow rate may be set to meet thermal dissipation requirements of components disposed in the front node and/or rear node.

For example, consider a scenario as illustrated in FIG. 4.5 where a front node is mated to a rear node. Components disposed in a rear node may require an airflow rate near the drop down line labeled c. The thermal manager of the rear node may set the fan speed at 50% to generate an airflow rate so that components within the rear node are afforded appropriate thermal dissipation while limiting energy consumption for airflow generation.

In another example, consider a scenario as illustrated in FIG. 4.5 where the rear node of FIG. 4.5 has been mated to a second front node having a different impedance curve (due, for example, due to the second front node having different components disposed within when compared to the front node of FIG. 4.5). The thermal manager of the rear node may set the fan speed at 100% to generate an airflow rate so that components within the rear node are afforded appropriate thermal dissipation.

As discussed above, components of the system of FIG. 1.1 may provide thermal management services. FIGS. 5.1-5.2 show methods that may be performed to provide thermal management services. While FIGS. 5.1-5.2 are illustrated as flow charts including a number of steps, methods in accordance with embodiments of the invention may include additional, fewer, and/or different steps without departing from the invention. Additionally, while the steps illustrated in FIGS. 5.1-5.2 are illustrated in a particular order, the steps may be performed in a different order, any number of steps may be omitted, and/or any number of steps may be performed in a parallel or partially overlapping manner without departing from the invention.

FIG. 5.1 shows a flowchart of a method in accordance with one or more embodiments of the invention. The method depicted in FIG. 5.1 be used to provide thermal management services to components disposed in a chassis in accordance with one or more embodiments of the invention. The method shown in FIG. 5.1 may be performed by, for example, a rear node (e.g., 130, FIG. 1.1). Other components of the system illustrated in FIG. 1.1 may perform all, or a portion, of the method of FIG. 5.1 without departing from the invention.

In step 500, a front node mating event is identified.

In one or more embodiments of the invention, the front node mating event is the physical attachment of a front node to a rear node. When front node is physically attached to a rear node, a thermal manager of the rear node may identify the mating event. For example, the thermal manager may identify that a front node has been attached to the rear node. The identification may be performed via any mechanism without departing from the invention. For example, the thermal manager may identify the attachment due to the formation of a new operable connection between the thermal manager and a component disposed in the front node. The component disposed in the front node may be an airflow characteristics manager.

In step 502, front node airflow characteristics are obtained.

In one or more embodiments of the invention, the front node airflow characteristics are obtained from an airflow characteristics manager disposed in front node. For example, when the front node is mated to the rear node, a thermal manager disposed in the rear node may become operably connected to an airflow characteristics manager disposed of the front node.

The thermal manager may send a request to the airflow characteristics manager for the airflow characteristics of the front node. The airflow characteristics manager of the front node may provide the airflow characteristics of the front node in response to the request. For example, the airflow characteristics manager of the front node may retrieve the airflow characteristics from the front node airflow characteristics repository and provide the airflow characteristics to the rear node. The airflow characteristics repository may be stored in the persistent storage of the front node.

The airflow characteristics repository may be stored in other locations without departing from the invention. For example, the airflow characteristics repository may be stored in a cloud resource or other device operably connected to the thermal manager. The airflow characteristics manager may provide this location information to the thermal manager and the thermal manager may retrieve the airflow characteristics of the front node using the provided location information. The location information may be, for example, an Internet protocol address. The location information may be different types of information for identifying the location of the airflow characteristics repository without departing from the invention.

In step 504, an airflow rate of the mated front node and the rear node is determined.

In one or more embodiments of the invention, the airflow rate is determined by identifying and intersection point between airflow characteristics of the front node and airflow characteristics of the rear node. For example, an intersection point between an impedance curve of a front node and an air volume-static pressure curve associated with the rear node may be identified. A thermal manager of a rear node may perform the identification.

For example, consider a scenario in which a front node has an impedance curve as shown in FIG. 4.3 and a rear node has an air volume-static pressure curve as shown in FIG. 4.4. In this scenario, the thermal manager may identify the intersection point as being at a flow rate of approximately 90 cubic feet per minute.

The thermal manager may identify the intersection point using any method without departing from the invention. For example, the thermal manager may compare the static pressure specified by each curve for each flow rate. The flow rate having the closest static pressures may be identified as the intersection point.

In another example, the thermal manager may identify the intersection point by solving a system of linear equations. For example, in some embodiments of the invention, the curves may be defined as fitted functions, e.g., higher order polynomials or other equations having coefficients designed such that the curved defined by the fitted functions match experimental data. In such a scenario, the intersection point may be identified by solving for the intersection point using the fitted functions. Any analytical method for solving for the intersection point may be used without departing from the invention.

The intersection point may specify that maximum achievable airflow rate through the chassis. In other words, it may not be possible or otherwise desirable to achieve a higher airflow rate through the chassis than that specified by the intersection point.

In step 506, it is determined whether the airflow rate associated with the intersection point is sufficient for thermal management purposes.

In one or more embodiments of the invention, the airflow rate associated with the intersection point is compared to state information associated with both a rear node and a front node to determine whether airflow rate sufficient for thermal management purposes. For example, as described with respect to FIGS. 4.1-4.2, repositories associated with both modules may include information regarding the minimum airflow rate necessary to provide appropriate heat dissipation for components disposed in both of the modules. If the airflow rate is less than that specified by the minimum airflow rate for either module, the airflow rate specified by the intersection point determined in step 504 may be determined as being insufficient.

If the airflow rate is determined as being insufficient for thermal management purposes, the method may proceed to step 510. If the airflow rate is determined as being sufficient for thermal management purposes, the method may proceed to step 508.

In step 508, operating point of airflow control components is set based on the airflow rate. In other words, the operating point of airflow control components disposed within the rear module and/or other locations may be set so that the airflow within the chassis matches the airflow rate determined in step 504.

For example, a thermal manager may include a lookup table that specifies the operating point for airflow control components for a range of different flow rates. The operating point for the airflow control components may be, for example, a duty cycle, voltage level, current level, or other adjustable characteristic of the airflow control components that allows for the airflow control components to produce different airflow rates within the chassis.

Once the operating points of the airflow control components are set, the operating points may be maintained without a closed feedback loop. That is, the operating points may be maintained using open-loop control. Such open-loop control may not consider the actual operating temperature or other information regarding the state of the system of FIG. 1.1.

The method may end following step 508.

Returning to step 506, the method may proceed to step 510 if the airflow rate is not sufficient for thermal management purposes.

In step 510, a thermal management failure is remediated.

In one or more embodiments of the invention, a thermal management failure occurs when an airflow rate required to dissipate heat from one or more components disposed in a chassis occurs.

The thermal management failure may be remediated by, for example, placing a limit on power consumption rate of a component associated with the thermal management failure. In other words, the power consumption by a component that cannot dissipate heat sufficiently at the airflow rate determined in step 504 may be limited. Limiting the power consumption of the component may decrease the heat dissipation rate required by the component to operate nominally.

For example, if the component is a processor, the maximum operating frequency of the processor may be limited. In another example, if the component is a memory module, the bus frequency that serves data to the memory may be reduced. Other characteristics of components disposed within the chassis may be controlled to reduce power consumption of the components without departing from the invention.

In one or more embodiments of the invention, the thermal management failure may be remediated by notifying the user. For example, a message indicating that the chassis is overheating may be sent to a cell phone or other interface device for the user. The user may be notified via other methods without departing from the invention.

The method may proceed to step 508 following step 510.

While the method illustrated in 5.1 may be utilized by an in-service chassis, embodiments of the invention include preparation of devices for in-service operations.

FIG. 5.2 shows a flowchart of a method in accordance with one or more embodiments of the invention. The method depicted in FIG. 5.2 be used to prepare a chassis for in-service operation in accordance with one or more embodiments of the invention.

In step 520, and impedance of the front node at its highest density cooling configuration is determined.

The impedance of the front node may be determined by generating different rates of airflow across a range and measuring the static pressure drop across the front node. For example, an air mover may generate an airflow of a predetermined rate within the front node and the pressure drop across the front node may be measured. This process may be repeated for different airflow rates across a predetermined range of airflow rates.

The highest density cooling configuration may be a configuration in which the largest number of components requiring the most thermal dissipation are disposed in the front node.

In step 522, an air volume-static pressure characteristic (PQ) curve for the rear node is determined.

In one or more embodiments of the invention, the PQ curve is generated for a range of airflow control device operating points. For example, the duty cycle, or other operating characteristic, of the airflow control devices may be varied and a PQ curve for each operating point may be determined. Thus, PQ curves for a range of different operating points for airflow components of the rear node may be generated.

The PQ curve of the rear node may be determined by generating different rates of airflow across a range of airflow rates and measuring the static pressure drop across the rear node. The airflow rates may be generated by airflow control devices disposed within the rear node. For example, air movers of the rear node may generate an airflow of a predetermined rate within the rear node and the pressure drop across the rear node may be measured. This process may be repeated for different airflow rates across a predetermined range of airflow rates.

In step 524, the net airflow rate when the front node is mated to the rear node is determined using impedance curve and the PQ curve.

The net airflow rate may be determined by identifying and intersection point between the impedance curve in the PQ curve.

In step 526, a temperature rise is determined based on the net airflow rate and airflow temperature limits.

In some scenarios, there may be limits on the maximum temperature of air exhausted from a chassis. For example, in a high density computing environment, the design of the high density computing environment may assume that the exhaust temperature of airflows from chassis within the high density computing environment do not exceed a predetermined temperature. Thus, the thermal dissipation of components within a chassis may be limited based on the design of the environment in which the chassis is to exist. Accordingly, for a given temperature of air for ventilation source used to generate the airflow, the thermal dissipation provided to components within the chassis may be limited because the maximum airflow rate may be limited due to the exhaust temperature limitations. Temperature rise may be determined based on the power consumption rate of the components and the thermal dissipation provided by the airflow at the net airflow rate.

In step 528, the maximum power consumption for components disposed in the chassis is determined. In other words, the power consumption for a scenario in which the highest possible power consumption components for the payloads disposed in the chassis is determined.

In step 530, the cooling capability of the chassis is determined based on the net airflow rate and the temperature rise is determined.

In step 532, is determined whether the cooling capability is greater than the maximum power consumption. If the cooling capability is greater than the maximum power consumption, the method may proceed to step 536. If the cooling capability is not greater than the maximum power consumption, the method may proceed to step 534.

In step 534, the maximum allowed in that temperature is determined. In other words, a maximum temperature for air used to generate airflow is determined because the cooling capability of the chassis is not sufficient to provide appropriate levels of thermal dissipation for all possible temperatures of air used to generate the airflow.

The maximum allowed inlet temperature may be added to a repository of a thermal manager of the rear node. Such information may be used to prevent the chassis from being utilized in a manner in which insufficient airflow can be generated by the chassis for cooling of components disposed within the chassis.

The method may end following step 534.

Returning to step 532, the method may proceed to step 536 following step 532 if the cooling capability of the chassis is not greater than the power consumption of potential components that may be disposed in the chassis.

In step 536, the chassis is rated at the maximum potential inlet temperature. In other words, no restrictions are placed on the chassis when used in environment where air for the airflow may be at temperatures that could be problematic for thermal dissipation purposes.

The method may end following Step 536.

To further clarify aspects of embodiments of the invention, a nonlimiting example is provided in FIGS. 6.1-6.3.

EXAMPLE

Consider a scenario illustrated in FIG. 6.1 where a rear node (600) and a front node (610) are being prepared for insertion into high-density computer environment. The front node (610) and the rear node (600) may be similar to the nodes illustrated in FIG. 6.1. The front node (610) has an impedance curve similar to that illustrated in FIG. 4.3 and the rear node (600) has an air volume-static pressure curve similar to that illustrated in FIG. 4.4.

To prepare the rear node (600) and the front node (610), the front node (610) is attached to the rear node (600) as shown in FIG. 6.2. When attached to the front node (610), a thermal manager (not shown) of the rear node (600) obtains airflow characteristics of the front node (610) from an airflow characteristics manager (not shown) of the front node (610). The thermal manager obtains airflow characteristics from the airflow characteristics manager via an operable connection that was formed via the attachment process.

FIG. 6.3 shows a plot of the air volume-static pressure curve (632) of the rear node and the impedance curve (634) of the front node. Once the thermal manager obtains the airflow characteristics of the front node, it identifies and intersection point (630) between the impedance curve (634) of the front node and the airflow characteristics of the rear node. Specifically, the air volume-static pressure curve (632).

As seen from FIG. 6.3, the intersection point (630) is at approximately an airflow rate of 90 cubic feet per minute. Based on the 90 cubic feet per minute rate, the thermal manager sets operating points of airflow control devices (e.g., fans) disposed in the rear node so that an airflow rate of 90 cubic feet per minute is generated within the chassis.

End of Example

FIG. 7 shows a diagram of a computing device in accordance with one or more embodiments of the invention. The computing device (700) may include one or more computer processors (702), non-persistent storage (704) (e.g., volatile memory, such as random access memory (RAM), cache memory), persistent storage (706) (e.g., a hard disk, an optical drive such as a compact disk (CD) drive or digital versatile disk (DVD) drive, a flash memory, etc.), a communication interface (712) (e.g., Bluetooth interface, infrared interface, network interface, optical interface, etc.), input devices (710), output devices (708), and numerous other elements (not shown) and functionalities. Each of these components is described below.

In one embodiment of the invention, the computer processor(s) (702) may be an integrated circuit for processing instructions. For example, the computer processor(s) may be one or more cores or micro-cores of a processor. The computing device (700) may also include one or more input devices (710), such as a touchscreen, keyboard, mouse, microphone, touchpad, electronic pen, or any other type of input device. Further, the communication interface (712) may include an integrated circuit for connecting the computing device (700) to a network (not shown) (e.g., a local area network (LAN), a wide area network (WAN) such as the Internet, mobile network, or any other type of network) and/or to another device, such as another computing device.

In one embodiment of the invention, the computing device (700) may include one or more output devices (708), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (702), non-persistent storage (704), and persistent storage (706). Many different types of computing devices exist, and the aforementioned input and output device(s) may take other forms.

Embodiments of the invention may provide an improved method for providing a management services within a chassis. Specifically, embodiments of the invention may provide a method for providing thermal management services using an open-loop control system. The open-loop control system may set the operating points of one or more airflow control devices disposed within a chassis based on (i) an impedance curve associated with a front node of the chassis and (ii) an airflow volume-static pressure curve associated with a rear node of the chassis. By doing so, the open-loop control system may manage airflow within the chassis in a manner that ensures components disposed within the chassis are provided with airflow sufficient to meet the thermal dissipation requirements necessary for nominal operation of the components.

Further, embodiments of the invention may enable the open-loop control system to determine the cooling capability of the chassis for any number of configurations of front and rear nodes. For example, the airflow characteristics of both front and rear nodes far a range of different payload configurations may be determined and used by the open-loop control system to ascertain the airflow rates achievable by the chassis. Thus, a chassis may identify whether it can meet the cooling requirements of different front node payloads without attempting and failing to cool a chassis.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An information handling system, comprising:
a rear node comprising:
an airflow control device; and
a thermal manager programmed to:
identify a front node mating event between the rear node and a front node;
in response to the front node mating event:
obtain front node airflow characteristics for the front node;
determine an airflow rate using, at least in part, the front node airflow characteristics; and
set an operating point of the airflow control device based on the airflow rate,
wherein the front node airflow characteristics comprises impedance curves that each specify an airflow impedance of the front node versus a flowrate of airflow through the front node.

2. The information handling system of claim 1, wherein the thermal manager is further programmed to:
after setting the operating point of the airflow control device, manage the operating point of the airflow control device using open-loop control.

3. The information handling system of claim 2, wherein the open control loop control assumes that when the front node is mated to the rear node the airflow rate will meet thermal dissipation requirements of components of the front node.

4. The information handling system of claim 2, wherein the open control loop control does not use an indicator of a temperature of any component of the front node when managing the operating point of the airflow control device.

5. The information handling system of claim 1, wherein determining the airflow rate using, at least in part, the front node airflow characteristics comprises:
identifying an intercept between an impedance curve of the impedance curves and an airflow characteristic curve associated with the rear node.

6. The information handling system of claim 5, wherein the airflow characteristic curve associated with the rear node is an air volume-static pressure characteristic curve.

7. The information handling system of claim 5, wherein the intercept is associated with the airflow rate.

8. A method for thermally managing an information handling system, comprising:
identifying, by a rear node of the information handling system, a front node mating event between the rear node and a front node;
in response to the front node mating event:
obtaining front node airflow characteristics associated with the front node;
determining an airflow rate using, at least in part, the front node airflow characteristics; and
setting an operating point of an airflow control device based on the airflow rate,
wherein the front node airflow characteristics comprises impedance curves that each specify an airflow impedance of the front node versus a flowrate of airflow through the front node.

9. The method of claim 8, wherein the method further comprises:
after setting the operating point of the airflow control device, managing the operating point of the airflow control device using open-loop control.

10. The method of claim 9, wherein the open control loop control assumes that when the front node is mated to the rear node the airflow rate will meet thermal dissipation requirements of components of the front node.

11. The method of claim 10, wherein the open control loop control does not use an indicator of a temperature of any component of the front node when managing the operating point of the airflow control device.

12. The method of claim 8, wherein determining the airflow rate using, at least in part, the front node airflow characteristics comprises:
identifying an intercept between an impedance curve of the impedance curves and an airflow characteristic curve associated with the rear node.

13. The method of claim 12, wherein the intercept is associated with the airflow rate.

14. The method of claim 12, wherein the airflow characteristic curve associated with the rear node is an air volume-static pressure characteristic curve.

15. A non-transitory computer readable medium comprising computer readable program code, which when executed by a computer processor enables the computer processor to perform a method for thermally managing an information handling system, the method comprising:
identifying, by a rear node of the information handling system, a front node mating event between the rear node and a front node;
in response to the front node mating event:
obtaining front node airflow characteristics associated with the front node;
determining an airflow rate using, at least in part, the front node airflow characteristics; and
setting an operating point of an airflow control device based on the airflow rate,
wherein the front node airflow characteristics comprises impedance curves that each specify an airflow impedance of the front node versus a flowrate of airflow through the front node.

16. The non-transitory computer readable medium of claim 15, wherein the method further comprises:
after setting the operating point of the airflow control device, managing the operating point of the airflow control device using open-loop control.

17. The non-transitory computer readable medium of claim 16, wherein the open control loop control assumes that when the front node is mated to the rear node the airflow rate will meet thermal dissipation requirements of components of the front node.

18. The non-transitory computer readable medium of claim 15, wherein determining the airflow rate using, at least in part, the front node airflow characteristics comprises:

identifying an intercept between an impedance curve of the impedance curves and an airflow characteristic curve associated with the rear node.

* * * * *